United States Patent
Sugawara

(10) Patent No.: US 7,554,114 B2
(45) Date of Patent: Jun. 30, 2009

(54) HIGH-HEAT-RESISTANT SEMICONDUCTOR DEVICE

(75) Inventor: Yoshitaka Sugawara, Osaka (JP)

(73) Assignee: The Kansai Electric Power Co., Inc., Osaka-shi (JP)

( * ) Notice: Subject to any disclaimer, the term of this patent is extended or adjusted under 35 U.S.C. 154(b) by 0 days.

(21) Appl. No.: 11/877,370

(22) Filed: Oct. 23, 2007

(65) Prior Publication Data
US 2008/0087898 A1    Apr. 17, 2008

Related U.S. Application Data

(62) Division of application No. 10/562,071, filed as application No. PCT/JP2004/010315 on Jul. 20, 2004.

(30) Foreign Application Priority Data
Jul. 30, 2003   (JP) ............................. 2003-283057

(51) Int. Cl.
  H01L 35/24   (2006.01)
  H01L 51/00   (2006.01)
(52) U.S. Cl. ...................................................... 257/40
(58) Field of Classification Search .................... 257/40
  See application file for complete search history.

(56) References Cited

U.S. PATENT DOCUMENTS

| | | | | |
|---|---|---|---|---|
| 5,612,399 | A  * | 3/1997 | Beckley et al. | 524/261 |
| 2002/0004251 | A1* | 1/2002 | Roberts et al. | 438/26 |
| 2002/0057057 | A1* | 5/2002 | Sorg | 313/512 |
| 2002/0122946 | A1* | 9/2002 | Kuck et al. | 428/447 |

* cited by examiner

*Primary Examiner*—Jerome Jackson, Jr.
*Assistant Examiner*—Anthony Ho
(74) *Attorney, Agent, or Firm*—Crowell & Moring LLP

(57) ABSTRACT

In a wide gap semiconductor device of SiC or the like used at a temperature of 150 degrees centigrade or higher, the insulation characteristic of a wide gap semiconductor element is improved and a high-voltage resistance is achieved. For these purposes, a synthetic high-molecular compound, with which the outer surface of the wide gap semiconductor element is coated, is formed in a three-dimensional steric structure which is formed by linking together organosilicon polymers C with covalent bonds resulting from addition reaction. The organosilicon polymers C have been formed by linking at least one organosilicon polymers A having a crosslinked structure using siloxane (Si—O—Si combination) with at least one organosilicon polymers B having a linear linked structure using siloxane through siloxane bonds.

4 Claims, 6 Drawing Sheets

HIGH-HEAT-RESISTANT SEMICONDUCTOR DEVICE

CROSS REFERENCE TO RELATED APPLICATIONS

This application is a division of co-pending application Ser. No. 10/562,071, filed Dec. 22, 2005.

TECHNICAL FIELD

The present invention relates to a high withstand voltage wide gap semiconductor device having high heat resistance.

BACKGROUND ART

Wide gap semiconductor materials such as silicon carbide (hereinafter represented as SiC) have excellent physical characteristics when compared with silicon (hereinafter represented as Si), that is, those materials have larger energy gaps, higher breakdown field strength by about one digit, and so on. Because of this, SiC receives attention as a suitable semiconductor material used for power semiconductor devices having high heat resistance and high withstand voltage.

As an example of conventional power semiconductor devices with high heat resistance and high withstand voltage using SiC, a power semiconductor device using a SiC diode element shown below is disclosed in Proceedings of 2001 International Symposium on Power Semiconductor Devices & IC's, pp. 27 to 30 (see Prior Art 1).

In the SiC diode element, a pn junction, which injects electrical charge on an SiC substrate, is formed of an epitaxial film grown by an epitaxial growth technique. The epitaxial film on the end region of the substrate is removed by mesa etching, following which a termination portion, which relieves an electric field, is formed by ion implantation. Specifically, the p-type epitaxial layer 0.7 μm thick is removed by using a mesa etching process of about 1 μm in depth, after which a passivation film is formed by using a 0.4 μm thick inorganic film such as silicon dioxide film. This conventional SiC diode element has a high withstand voltage of 12 kV to 19 kV.

FIG. 6 is a cross-sectional view of a package in which an SiC diode device is formed by using the conventional SiC diode element described above. In FIG. 6, an SiC diode element 90 is mounted on the upper surface of a metal support 93, which has a cathode terminal 92 on its lower surface, in such a way that the cathode electrode 97 of the diode element 90 is connected to the upper surface of the support 93. The support 93 is further provided with an anode terminal 91 in such a manner that the terminal 91 passes through the support 93 with electrical insulation kept between them via an insulator 12. The anode terminal 91 is connected to the anode electrode 96 of the SiC diode element 90 by using a lead wire 8. A metal cap 94 is provided on the upper surface of the support 93 so as to cover the diode element 90, thereby a space including the diode element 90 is sealed. The space 95 is filled with sulfur hexafluoride gas. The reason why sulfur hexafluoride gas is provided is as follows: since a creeping distance between the anode electrode 96 and the exposed sides 90a uncovered with a passivation film 98 is short, its withstand voltage cannot be increased.

To increase the withstand voltage, it is also considered that inert gasses such as nitrogen gas and noble gasses such as argon gas are used as insulating gas. However, since these gasses are low in maximum breakdown electric field strength, electric discharge develops in the gasses during the application of high voltages, thereby the SiC diode element 90 itself and passivation film 98 such as silicon dioxide film are damaged. Therefore, to increase the withstand voltage, the package is filled with sulfur hexafluoride gas which is extremely stable even at a high temperature of the order of 150° C. to prevent breakdown resulting from electric discharge.

Patent Reference 1: Japanese Patent No. 3395456
Patent Reference 2: Japanese Patent No. 3409507
Non-Patent Reference 1: Proceedings of 2001 International Symposium on Power Semiconductor Devices & IC's pp. 27 to 30

DISCLOSURE OF THE INVENTION

Problems to be Solved by the Invention

With the insulating gas, sulfur hexafluoride gas has the best insulating properties at present; however, since the gas contains fluorine, there is a necessity to avoid its use in terms of the prevention of global warming. To give a semiconductor device particularly high insulating properties, it is necessary to set the pressure of sulfur hexafluoride gas, which is filled in the semiconductor device, at about two atmospheres at ordinary temperature. When the temperature of the semiconductor device increases during its use, the pressure of the gas exceeds 2 atmospheres. Because of this, if the package of the semiconductor device is not considerably robust, there is a danger that the device explodes or the gas leaks out. Wide gap semiconductor devices are sometimes operated at an elevated temperature close to 500° C. In those cases, the gas is heat expanded and therefore, the pressure of the gas is increased considerably, thereby the danger of the explosion or the gas leakage is further increased. Besides, at elevated temperatures, sulfur hexafluoride gas is pyrolytically decomposed, so that there are problems of a decrease in withstand voltage and so on as well.

As conventional materials having excellent insulating properties other than sulfur hexafluoride gas, there are a synthetic high-molecular compound which contains polymethylphenylsiloxane having the linear structure of siloxane (Si—O—Si combination) and a synthetic high-molecular compound which contains polyphenylsilsesquioxane having the crosslinked structure of siloxane. The former compound is generally called silicone rubber (Si rubber). At a temperature of 150° C. or lower, high insulating properties can be maintained by covering entire semiconductor elements (semiconductor chips) with covertures made of these synthetic high-molecular compounds.

Although polymethylphenylsiloxane is not so high in heat resistance, there is no problem when it is used at a junction temperature which falls within the range of 150° C. or lower like a Si power semiconductor element. However, when it is used at a high temperature of 200° C. or higher like a semiconductor element using SiC as a wide gap semiconductor material, it cannot be said that polymethylphenylsiloxane has sufficient heat resistance. When the temperature of the SiC semiconductor element exceeds 200° C., a coverture of polymethylphenylsiloxane loses its flexibility. Moreover, the temperature of the SiC semiconductor element exceeds 250° C. in air, the coverture becomes rigid completely due to vitrification. Because of this, the temperature of the SiC semiconductor element reverts to room temperature, many cracks develop within the coverture of polymethylphenylsiloxane.

In addition, when an element covered with polymethylphenylsiloxane is operated at an elevated temperature for a long time in an atmosphere of an inert gas such as sulfur hexafluoride gas, the element loses weight and voids and cracks develop at the vicinity of the surface of the element. It is considered that this is because methyl groups and phenyl groups on the side chains of polymethylphenylsiloxane decompose to evaporate. When such voids and cracks develop, the protection of the surface of the element becomes imperfect, so that leakage current increases. Moreover, the passivation film of the element may suffer damage during the development of the cracks. As a result of this, the leakage current increases greatly, so that the semiconductor element may be brought into destruction. As described above, polymethylphenylsiloxane has excellent heat resistance at low temperatures but has the disadvantage that such a function is lost at high temperatures.

Although being excellent in heat resistance, polyphenylsilsesquioxane is brittle and cracks easily. Because of this, it is difficult to form such a compound into a thick film. When polyphenylsilsesquioxane is used, it is applied to the surface of an element in a thickness of several micrometers. However, the compound is restricted in withstand voltage with the thickness of several microns, so that it has been impossible to use the compound for semiconductor devices having withstand voltages of 3 kV or higher.

An object of the present invention is to provide a wide gap semiconductor device with a high withstand voltage in which a semiconductor element constituting the semiconductor device is covered with a substance having a high withstand voltage and high heat resistance.

Means for Solving the Problems

The semiconductor device according to the present invention is characterized in that a semiconductor element and at least a part of electrical connecting portions, which are used for electrically connecting the semiconductor element to an external device, are covered with a synthetic high-molecular compound. The synthetic high-molecular compound contains a first organosilicon polymer (hereinafter referred to as "organosilicon polymer A"), which has at least one selected from the group consisting of polyphenylsilsesquioxane, polymethylsilsesquioxane, polyethylsilsesquioxane, and polypropylsilsesquioxane having crosslinked structures using siloxane (Si—O—Si combination), and a second organosilicon polymer (hereinafter referred to as "organosilicon polymer B") which has at least one selected from the group consisting of polydimethylsiloxane, polydiethylsiloxane, polydiphenylsiloxane, and polymethylphenylsiloxane having linear linked structures using siloxane. The organosilicon polymer A and the organosilicon polymer B are alternately and linearly linked with each other by siloxane bonds to form a large third organosilicon polymer. The synthetic high-molecular compound described above has a three-dimensional steric structure by sterically linking a number of the large third organosilicon polymers with covalent bonds resulting from addition reaction.

The organosilicon polymers A and B are alternately and linearly linked with each other by siloxane bonds to form the large third organosilicon polymer having a molecular weight of $2\times10^4$ to $8\times10^5$. It is preferable that a number of the third organosilicon polymers be linked with one another by alkylene groups.

The organosilicon polymer A having the crosslinked structure using siloxane is excellent in electrical insulation properties and heat resistance and has a high withstand voltage and high heat resistance, while it is very poor in flow properties.

According to the invention, the organosilicon polymer A and the organosilicon polymer B, which has the linear linked structure using siloxane, are alternately and linearly linked with each other. As a result, it is possible to obtain the synthetic high-molecular compound having the two properties, i.e., high heat resistance and a high withstand voltage without losing flexibility possessed by the organosilicon polymer B while maintaining excellent heat resistance of the organosilicon polymer A. To increase heat resistance further, the molecular weight of the organosilicon polymer A can be increased; however, in that case, flexibility decreases. Also, to increase flexibility, the molecular weight of the organosilicon polymer B can be increased; however, in that case, heat resistance decreases. It is preferable that the organosilicon polymer A have a molecular weight of $1\times10^3$ to $1\times10^5$ and the organosilicon polymer B have a molecular weight of $5\times10^3$ to $2\times10^5$. It is preferable that the molecular weight of the organosilicon polymer A be lower than that of the organosilicon polymer B.

The synthetic high-molecular compound according to the invention has such high insulation properties, that is, high withstand voltage capability because the bonds thereof are mostly siloxane bonds. The synthetic high-molecular compound according to the invention is absolutely excellent in affinity for inorganic films, such as silicon dioxide and silicon nitride used as passivation films of wide gap semiconductor elements, and hence, firmly adheres to surfaces of such passivation films. And further, the synthetic high-molecular compound according to the invention is also absolutely excellent in affinity for SiC wide gap semiconductors themselves, GaN wide gap semiconductor themselves, and so on and hence, has excellent adhesive properties so as to firmly adhere to surfaces of their semiconductor elements for sealing.

Since a semiconductor device, which has a wide gap semiconductor element sealed by being covered with the synthetic high-molecular compound having such excellent adhesive properties, has high moisture resistance, a high-reliability semiconductor device can be implemented. The synthetic high-molecular compound is absolutely excellent in affinity for SiC wide gap semiconductor devices, GaN wide gap semiconductor devices, and so on. For example, even when a wide gap semiconductor is exposed due to the presence of defective portions, such as pinholes, in its passivation film, such a high degree of reliability can be implemented because the synthetic high-molecular compound acts as a passivation film which directly protects the surface of the wide gap semiconductor element.

The organosilicon polymer B has about the same molecular structure as that of Si rubber. Therefore, as having been corroborated by using Si rubber up to now, the organosilicon polymer B is absolutely excellent in adhesive properties to inorganic substances, various metals such as copper, aluminum, and stainless steel, various resins such as epoxy resin, acrylic resin, and phenol resin, various glasses, and so on used for passivation films and therefore, firmly adheres to those substance. Because of this, the surface protective film of the synthetic high-molecular compound firmly and closely adheres to the metal electrodes, electrical connecting portions, support, and so on of a semiconductor element without any gaps as well. Because of this, high moisture resistance can be obtained, thereby a semiconductor device having high reliability and withstand voltage capability can be implemented.

Having the siloxane structures largely, the synthetic high-molecular compound according to the invention has high transmittancy to ultraviolet rays and visible light. On this account, it is possible to visually observe a state in which the synthetic high-molecular compound is applied to a semiconductor element and electrical connecting portions. For example, it is possible to effectively perform an application operation while visually checking the nonpresence of bubbles, voids, and so on.

In the wide gap light-emitting power semiconductor device and the wide gap photocoupled power semiconductor device using the synthetic high-molecular compound according to the invention, it is possible to satisfy both high-temperature high withstand pressure function, by which the semiconductor elements can be protected even at elevated temperatures, and high-efficiency photocoupling function which transmits light well even at elevated temperatures together.

EFFECT OF THE INVENTION

A high-heat-resistant wide gap semiconductor device according to the present invention has a structure in which the upper surface and the sides of a semiconductor element are covered with a synthetic high-molecular compound. The synthetic high-molecular compound contains at least an organosilicon polymer A, which mainly comprises polysilsesquioxane having a crosslinked structure using siloxane (Si—O—Si combination), and an organosilicon polymer B which has a linear linked structure using siloxane. The organosilicon polymers A and B alternately and linearly linked with each other by a siloxane bond to form a large organosilicon polymer having a molecular weight of $2 \times 10^4$ to $8 \times 10^5$.

The two large organosilicon polymers are linked with each other by a covalent bond resulting from addition reaction, thereby the synthetic high-molecular compound having a three-dimensional steric structure is formed. Having the siloxane bond mostly, the synthetic high-molecular compound having such a structure has a high withstand voltage property even at elevated temperatures and are absolutely excellent in affinity for inorganic films such as silicon dioxide and silicon nitride used as the wide gap semiconductor and the passivation film thereof. Because of this, since the synthetic high-molecular compound firmly adheres to the surface of the semiconductor element, the semiconductor device having high moisture resistance can be implemented and a high withstand voltage property can be achieved with particular reliability when the semiconductor device is operated at elevated temperatures.

A semiconductor device according to another aspect of the invention has at least one semiconductor element attached onto a substrate having favorable thermal conductivity and electrical connecting portions which electrically connect the semiconductor element and external devices. The semiconductor element and at least a part of the electrical connecting portions are covered with a first synthetic high-molecular compound containing a compound having a three-dimensional steric structure formed by linking plural third organosilicon polymers with a covalent bond resulting from addition reaction. The third organosilicon polymer has been formed by linking at least one first organosilicon polymer having a crosslinked structure using siloxane (Si—O—Si combination) with at least one second organosilicon polymer having a linear linked structure using siloxane, through a siloxane bond.

The semiconductor device has a case made of a hard resin, which is provided on the substrate, so as to house the semiconductor element and the electrical connecting portions covered with the synthetic high-molecular compound. A space within the case is filled with the second synthetic high-molecular compound which mainly comprises polyphenylsilsesquioxane and polydimethylsiloxane. The case is provided with external connecting terminals which are connected to the electrical connecting portions and leads outside the case.

According to the invention, by housing at least one semiconductor elements within a case, the semiconductor elements are less apt to suffer the influence of external environments. By covering a semiconductor element with a synthetic high-molecular compound, a high withstand voltage can be obtained. Moreover, when the case has suffered a shock externally, the semiconductor element, electrical connecting conductors, and so on within the case become less apt to suffer the influence of the shock by filling a space within the case with a relatively soft synthetic high-molecular compound. By housing plural semiconductor elements within the case to form a module, a semiconductor device can be provided which can be used easily and manufactured at low cost.

BRIEF DESCRIPTION OF THE DRAWINGS

FIG. 3 is a cross-sectional view of the SiC-GTO thyristor device according to the second example of the invention cut along a direction vertical to a sheet of paper in which FIG. 2 is represented.

DESCRIPTION OF THE REFERENCE NUMERALS

Figure 1:
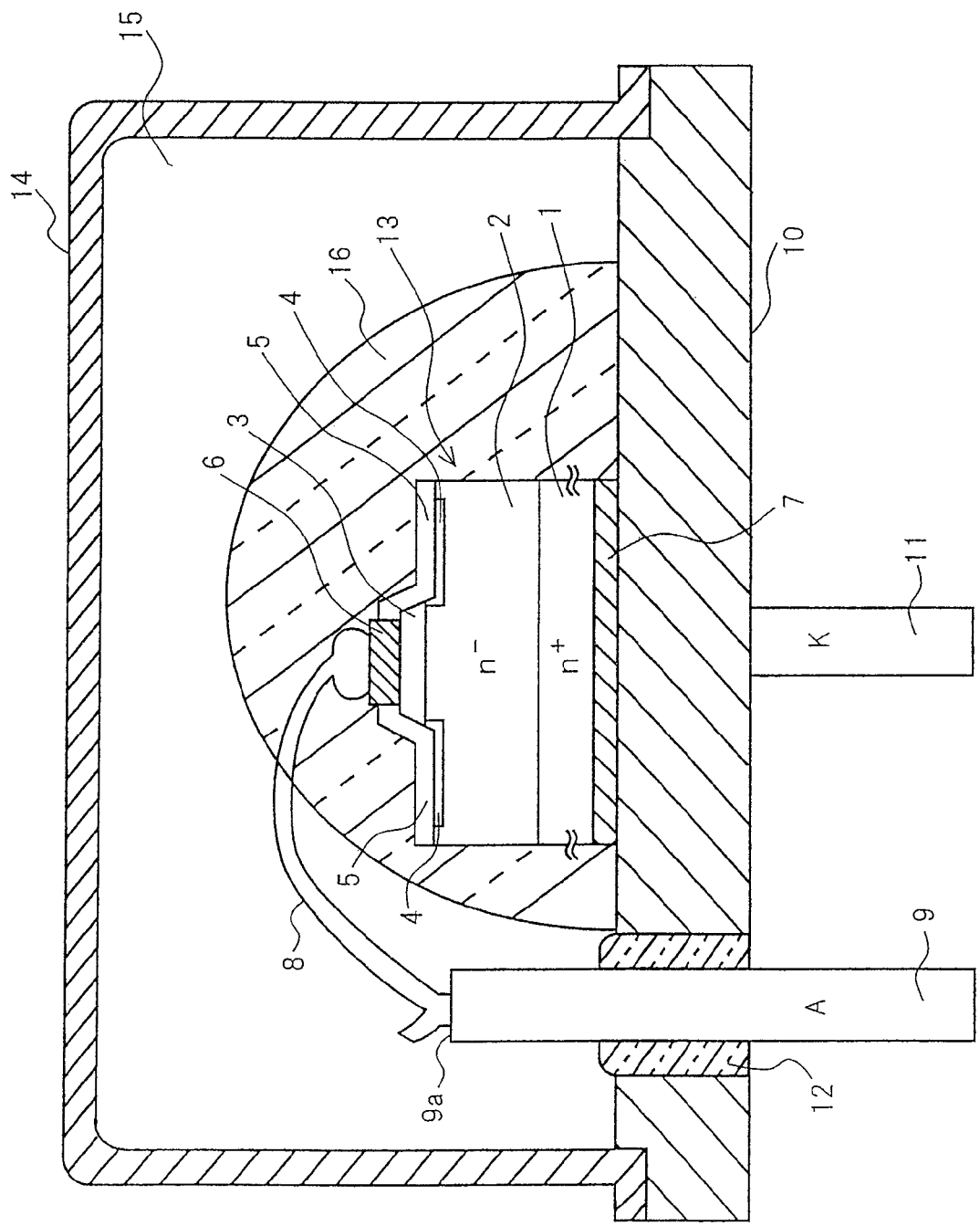
FIG. 1 is a cross-sectional view of an SiC-pn diode device according to a first example of the present invention.

1: cathode region
2: drift region
3: anode region
4: field-relief termination region
5: passivation film
6: anode electrode
7: cathode electrode
8: lead wire
9: anode terminal
10: support
11: cathode terminal
12: insulating glass
13: SiC diode element
14: metal cap
15: inert gas such as nitrogen
16, 42, 81: coverture
20: GTO thyristor element
21: cathode region
22: p-type base region
23: p-type drift layer
24: n-type base region
25: anode region
27: passivation film
29: anode electrode
31: gate electrode
32: cathode electrode
34, 36: gold lead wire
51: GaN-npn bipolar transistor
52: SiC photodiode
53: collector region
54: base region
55: emitter region 57: passivation film
60: light-emitting aperture
80: light-receiving portion
101: copper substrate
102: frame
105: cover
116, 118: insulating substrate
130, 131: coverture
165: filler

BEST MODE FOR CARRYING OUT THE INVENTION

Preferred examples of a semiconductor device according to the present invention will be described below with reference to FIGS. 1 to 5. To facilitate the understanding of the configuration of individual components in each figure, the dimensions of the illustrated individual components do not correspond to the actual dimensions thereof. The term "semiconductor device" as used in each example refers to a device in which a semiconductor element is housed in a package and in which the electrodes of the semiconductor element are each connected to electrode terminals via lead wires.

FIRST EXAMPLE

A high-heat-resistant semiconductor device according to a first example of the present invention will be described with reference to FIG. 1.

The semiconductor device according to the first example of the invention is an SiC (silicon carbide) pn diode high in heat resistance and withstand voltage.

FIG. 1 is a cross-sectional view of the SiC pn diode with a withstand voltage of 8 kV according to the first example of the invention. In FIG. 1, an SiC diode element 13 has the following structure. An about 90 µm thick n-type SiC drift layer 2 with a low impurity concentration is formed on the upper surface of an about 300 µm thick n-type SiC cathode region 1 with a high impurity concentration. A cathode electrode 7 is formed on the lower surface of the cathode region 1. A p-type SiC anode region 3 forming a main junction is formed on the central region of the drift layer 2.

A metal anode electrode 6 is formed on the anode region 3. A p-type field-relief region 4 is formed on the periphery of the anode region 3. On the upper surface of the SiC diode element 13 including the anode region 3 and the field-relief region 4, a three-layer-structured surface protective film 5 is formed which is laminated with a silicon dioxide layer, a silicon nitride layer, and a silicon dioxide layer in that order. The anode electrode 6 is connected to the upper end 9a of an anode terminal 9 by using a gold lead wire 8 serving as an electrically connecting portion. In FIG. 1, the lead wire 8 is illustrated as a single wire; however, when the value of a current flowing through the lead wire 8 is high, the lead wire 8 can be used plurally according to the value, that is, lead wires 8 can be connected in parallel with one another.

The cathode electrode 7 is attached to a metal support 10 while keeping an electric connection. The anode terminal 9 is fixed to the support 10 via an insulating glass 12 with a high melting point while keeping electrical insulation. A cathode terminal 11 is connected to the support 10. The anode terminal 9 and the cathode terminal 11 are connected to the wiring of an external device or the like. Over the upper surface of the support 10, a metal cap 14 is provided so as to cover the SiC diode element 13 and the upper end 9a of the anode terminal 9, thereby a space 15 including the SiC diode element 13 is sealed. A coverture 16 made of a synthetic high-molecular compound is provided so as to cover the SiC diode element 13 and part of the lead wire 8 inside the space 15. The coverture 16 is formed of the transparent synthetic high-molecular compound which contains polyphenylsilsesquioxane as a first organosilicon polymer (hereinafter referred to as an organosilicon polymer A) and polydimethylsiloxane as a second organosilicon polymer (hereinafter referred to as an organosilicon polymer B). The space 15 is enclosed with nitrogen gas.

An example of a method for manufacturing the SiC pn diode according to the example will be described below. As shown in FIG. 1, the prefabricated SiC diode element 13 is soldered at a predetermined place in the upper surface of the support 10 by using hot solder containing gold silicon. Both ends of the 80-micrometer-diameter lead wire 8 of plural gold wires are connected to the anode electrode 6 and the upper end 9a of the anode terminal 9 by using a lead bonding apparatus.

Then the synthetic high-molecular compound described above is applied so as to cover the entire surface of the SiC diode element 13 and the vicinity of the junction of the lead wire 8 and the anode electrode 6 for the formation of the coverture 16. As a method of the application, a method is suitable in which the predetermined amount of synthetic high-molecular compound is extruded from a nozzle having a hole with a predetermined diameter.

When kept at a temperature of about 200° C. for a predetermined time period after the application, the synthetic high-molecular compound cures while keeping a certain degree of flexibility. When the synthetic high-molecular compound whose viscosity has been suitably adjusted is applied, the compound bulges in the shape of a mountain as the coverture 16 shown in FIG. 1. At this time, the compound is applied in such a way that the entire SiC diode element 13 can be closely covered with the compound by a thickness of 200 µm or more. When the viscosity is too high, gaps may develop between the SiC diode element 13 and the coverture 16 during the application. In contrast, when the viscosity is too low, the compound do not bulge mountainously and therefore, the coverture 16 having a desired thickness of 200 µm or more cannot be obtained.

Finally, the metal cap 14 is attached to the support 10 to weld them together in an nitrogen atmosphere, and then the internal space 15 is filled with nitrogen gas, thereby the fabrication of the SiC pn diode is completed.

When a voltage (reverse voltage) was applied between the anode terminal 9 and the cathode terminal 11 of the SiC pn diode according to this example in such a way that the cathode terminal 11 became higher in electric potential, a measured reverse withstand voltage was about 8.5 kV. Even at an elevated temperature at which Si semiconductor devices are incapable of operation, for example, a temperature of 300° C., it was possible to maintain such a reverse withstand voltage. When the reverse voltage was 8 kV, a leakage current density was equal to or lower than $5 \times 10^{-5}$ A/cm$^2$. Although the SiC pn diode element according to this example was subjected to a 500 hour continuous-current test by flowing a current with a current density of 200 A/cm$^2$ in a high-temperature atmosphere of 250° C., neither crack nor deformation occurred in the coverture 16 of the synthetic high-molecular compound after the completion of the test. Besides, cloudiness and so on which decrease the transparency thereof did not occur as well.

A forward voltage during energization was 4.3 v and almost did not change both prior to and subsequent to the 500 hour continuous-current test. When a leakage current was measured by applying a reverse voltage of 8 kV in a high-temperature atmosphere of 300° C. after the completion of the 500 hour continuous-current test, a current density was $3 \times 10^{-5}$ A/cm$^2$ and therefore, there was little difference between the current densities prior to and subsequent to the continuous-current test. After the tests described above, the semiconductor devices were taken apart and observed visually. As a result, it was found that the coverture 16 of the synthetic high-molecular compound, which contains polyphenylsilsesquioxane as the organosilicon polymer A and polydimethylsiloxane as the organosilicon polymer B, firmly adheres onto not only the surface protective film 5 on the field-relief region 4 of the SiC diode element 13 but the SiC layers exposed in the sides of the SiC diode element 13. In addition, a reverse recovery time, which serves as a measure of the operation speed of the SiC pn diode, was about 50 nanoseconds and a change in the reverse recovery time was not found both prior to and subsequent to the tests.

According to the first example of the invention, the periphery of the SiC diode element 13 is coated with the synthetic high-molecular compound containing the organic polymer A and the organic polymer B in their pre-determined proportions. As a consequence, it is possible to acquire the same insulating property as that effected in a case where the SiC diode element 13 is placed in an atmosphere of sulfur hexafluoride gas. That is, an SiC pn diode having a high heat resistance and a high insulating property can be implemented without the use of sulfur hexafluoride gas which is a hazardous substance adversely affecting global warming.

SECOND EXAMPLE

Figure 2:
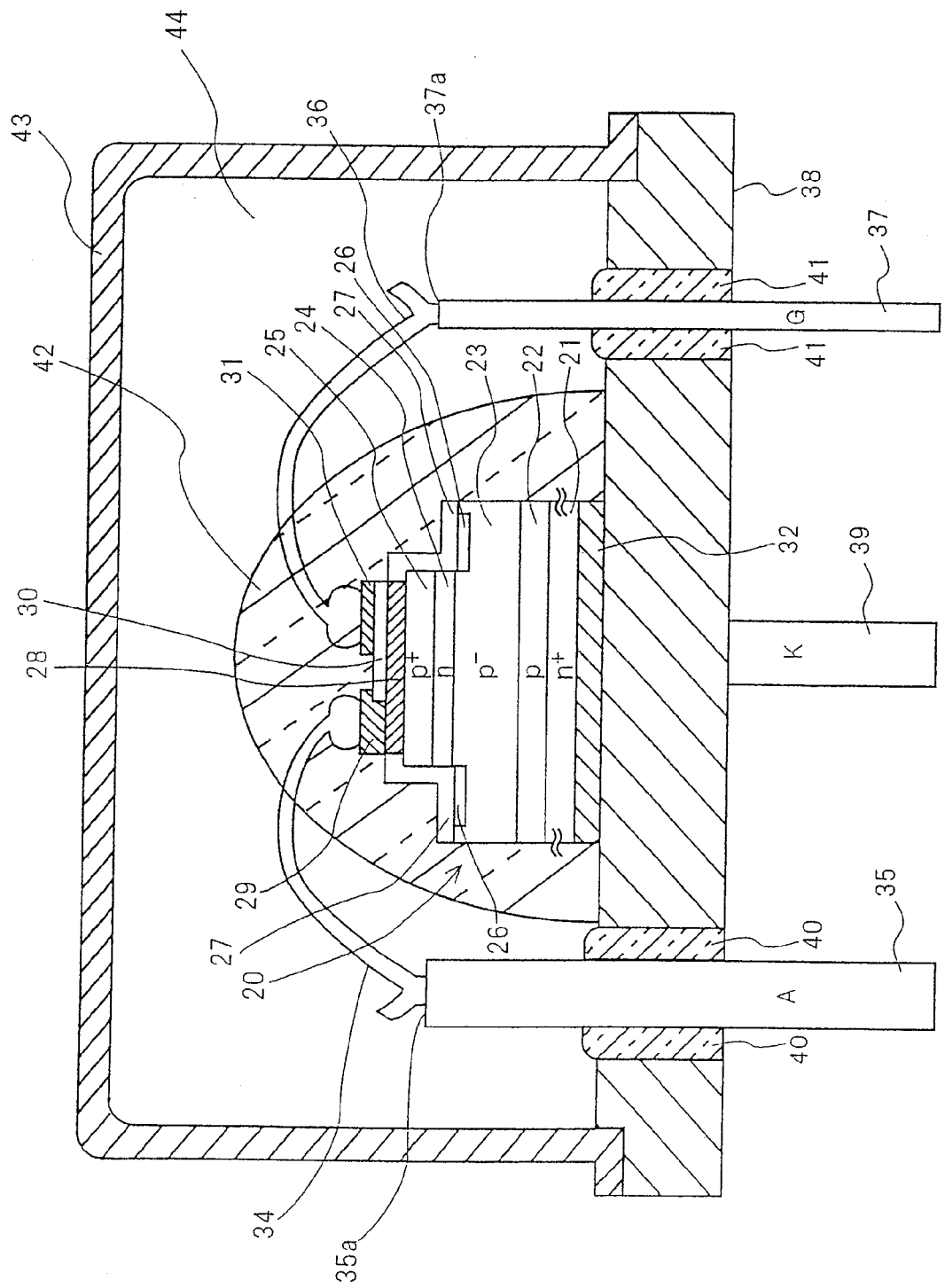
FIG. 2 is a cross-sectional view of an SiC-GTO thyristor device according to a second example of the invention.
Figure 3:
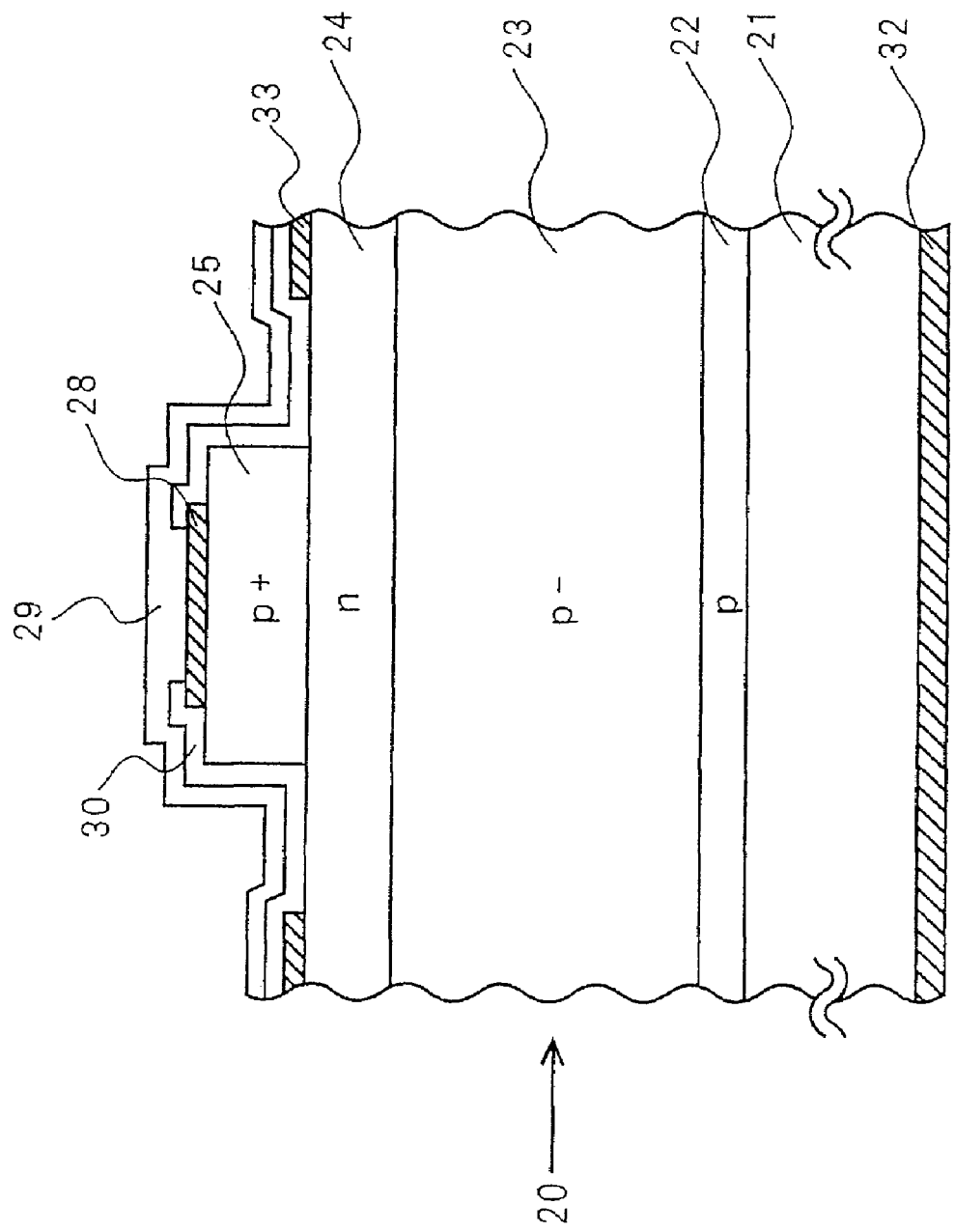

A semiconductor device according to a second example of the invention is an SiC-GTO thyristor (gate turn off thyristor) device having a withstand voltage of 5 kV, and FIG. 2 is a cross-sectional view of the thyristor. FIG. 3 is a cross-sectional view of a cell indicated by cutting the GTO thyristor element 20 along a direction which is vertical to a sheet of paper in which FIG. 2 is represented. With the actual element, the cell shown in FIG. 3 is present plurally, that is, the cells are linked along the lateral direction of FIG. 3. In FIGS. 2 and 3, a p-type SiC buffer layer 22 about 3 µm thick is provided on the upper surface of a n-type SiC cathode region 21 about 320 µm thick having a high impurity concentration. A cathode electrode 32 is provided on the lower surface of the cathode region 21. A p-type SiC drift layer 23 abort 60 µm thick having a low impurity concentration is provided on the buffer layer 22. A n-type base region 24 about 2 µm thick and a p-type anode region 25 about 2 µm thick are formed on the central portion of the drift layer 23 in that order.

A n-type field-relief region 26 is formed on the periphery of the n-type base region 24. A three-layer-structured surface protective film 27 comprising a silicon dioxide layer, a silicon nitride layer, and a silicon dioxide layer in that order is formed on the surface of the GTO thyristor element 20. An anode electrode 28 is formed on the p-type anode region 25. In the left region of the upper surface of the anode electrode 28, a second-layer anode electrode 29 is formed and in the right region of the upper surface, a gate electrode 31 is formed via an insulating film 30. As shown in FIG. 3, a first-layer gate electrode 33 is formed in the n-type base region 24 and connected to the gate electrode 31 at a junction not shown.

The anode electrode 29 is connected to the upper end 35*a* of an anode terminal 35 by using a gold lead wire 34. The gate electrode 31 is connected to the upper end 37*a* of a gate terminal 37 by using a gold lead wire 36. The lead wires 34 and 36, the anode terminal 35, and the gate terminal 37 are electrical connecting means. The cathode electrode 32 is mounted on a metal support 38 having a cathode terminal 39. The cathode electrode 32 of the GTO thyristor element 20 is generally soldered to the support 38 by using a hot solder of gold silicon. The anode electrode 35 and the gate electrode 37 are fixed through the support 38 while retaining electrical insulation to the support 38 through the use of individual high-melting insulating glasses 40 and 41.

A coverture 42 made of a synthetic high-molecular compound is applied so as to cover the entire surface of the GTO thyristor element 20 and the vicinities of junctions between the lead wires 34 and 36 and the GTO thyristor element 20. The coverture 42 is the synthetic high-molecular compound containing polymethylsilsesquioxane as an organosilicon polymer A and polymethylphenylsiloxane as an organosilicon polymer B. Finally, by attaching a metal cap 43 to the support 38 to weld them in a nitrogen atmosphere, the SiC-GTO thyristor device is brought to completion in which nitrogen gas is enclosed in an internal space 44.

The lead wires 34 and 36 are gold wires of 80 micrometers in diameter and are each attached between the anode electrode 29 and the anode terminal 35 and between the gate electrode 31 and the gate terminal 37 by using a lead bonding apparatus. In FIG. 2, although the lead wires 34 and 36 are each illustrated as a single wire, the lead wires 34 and 36 may be plurally used according to the values of individual currents flowing through the lead wires 34 and 36 so as to be connected in parallel with one another.

In the SiC-GTO thyristor device according to the second example, when a forward voltage of 5 kV was applied such that an electric potential of the anode terminal 35 becomes higher than that of the cathode terminal 39, and then an electric potential of the gate terminal 37 was made equal to that of the anode terminal 35, an off state in which a current does not flow was maintained and a withstand voltage of 5 kV was obtained.

Thereafter, when the electric potential of the gate terminal 37 is made lower than that of the anode terminal 35 in the off state and a gate current is fed from the anode terminal 35 toward the gate terminal 37, the SiC-GTO thyristor device is turned on and the current flows between the anode terminal 35 and the cathode terminal 39. And further, when the electric potential of the gate terminal 37 is made higher than that of the anode terminal 35 in the on state, the current flowing between the anode terminal 35 and the cathode terminal 39 is commutated between the gate terminal 37 and the cathode terminal 39, thereby the SiC-GTO thyristor device is turned off. A voltage between the anode terminal 35 and the cathode terminal 39 effected at this time is called a reverse withstand voltage.

Specifically, when a negative voltage is applied to the cathode terminal 39 and a voltage equal to or higher than a built-in voltage is applied to the gate terminal 37 based on the voltage at the anode terminal 35, the SiC-GTO thyristor device is turned on. At this time, since electrons are injected from the cathode region 22 into the drift layer 23, a change in an electrical conductivity occurs, thereby an on resistance greatly decreases. When the electric potential of the gate terminal 37 is made higher than that of the anode terminal 35 in the state in which the SiC-GTO thyristor has been turned on, part of the current flowing between the anode terminal 35 and the cathode terminal 39 is drew out of the gate terminal 37, thereby the GTO thyristor can be turned off.

The reverse withstand voltage of the SiC-GTO thyristor device according to the second example was about 5.8 kV and was able to be maintained even in a high-temperature atmosphere of 250° C. The leakage current density thereof effected at a reverse voltage of 5 kV was as excellent as $3 \times 10^{-4}$ A/cm$^2$ or lower. As described below, first and second operation tests were conducted on the SiC-GTO thyristor device according to this example.

In the first operation test, the SiC-GTO thyristor according to this example was continuously operated in a high-temperature atmosphere of 250° C. for 200 hours while feeding a current having a current density of 200 A/cm$^2$. Incidentally, conventional silicon GTO thyristors are unable to operate at a temperature of 250° C. Besides, in silicon GTO thyristors having a withstand voltage of 5 kV category, it is difficult to manufacture ones which are able to handle a current density of 200 A/cm$^2$.

In the second operation test, the SiC-GTO thyristor according to this example was continuously operated in an atmosphere of a high temperature of 80° C. and a high humidity of 85% for 200 hours while feeding a current having the current density described above. When the SiC-GTO thyristor device was taken apart to check it for defects after the completion of the first and second operation tests, the coverture 42 of the synthetic high-molecular compound had no deformation, crack, and cloudiness.

The forward voltage of the SiC-GTO thyristor immediately after the start of the first operation test was 4.3 V. After the completion of the first and second operation tests, the forward voltages thereof were measured under the same conditions as those for the first operation test. As a result, the measured values thereof were about the same as that given at the time of the start of the first operation test and their difference was in the range of their measurement error.

When a reverse voltage of 5 kV was applied after the completion of the first and second operation tests, the leakage current density thereof was $5 \times 10^{-4}$ A/cm$^2$ or lower at a temperature of 250° C. and changed little. A turn-on time was 0.5 microseconds and a turn-off time was 0.8 microseconds. These switching times also did not change both prior to and subsequent to the first and second operation tests. Incidentally, the turn-on and turn-off times of the SiC-GTO thyristor according to this example is about one-twentieth those of conventional silicon GTO thyristors having a withstand voltage of 6 kV.

When the state of the adhesion of the synthetic high-molecular compound used in this example and applied to the GTO thyristor element 20 to the GTO thyristor element 20 and so on was checked, it was found that the synthetic high-molecular compound firmly adheres to not only the protective film 27 on the field-relief region 26 of the GTO thyristor element 20 but the exposed SiC sides thereof.

THIRD EXAMPLE

Figure 4:
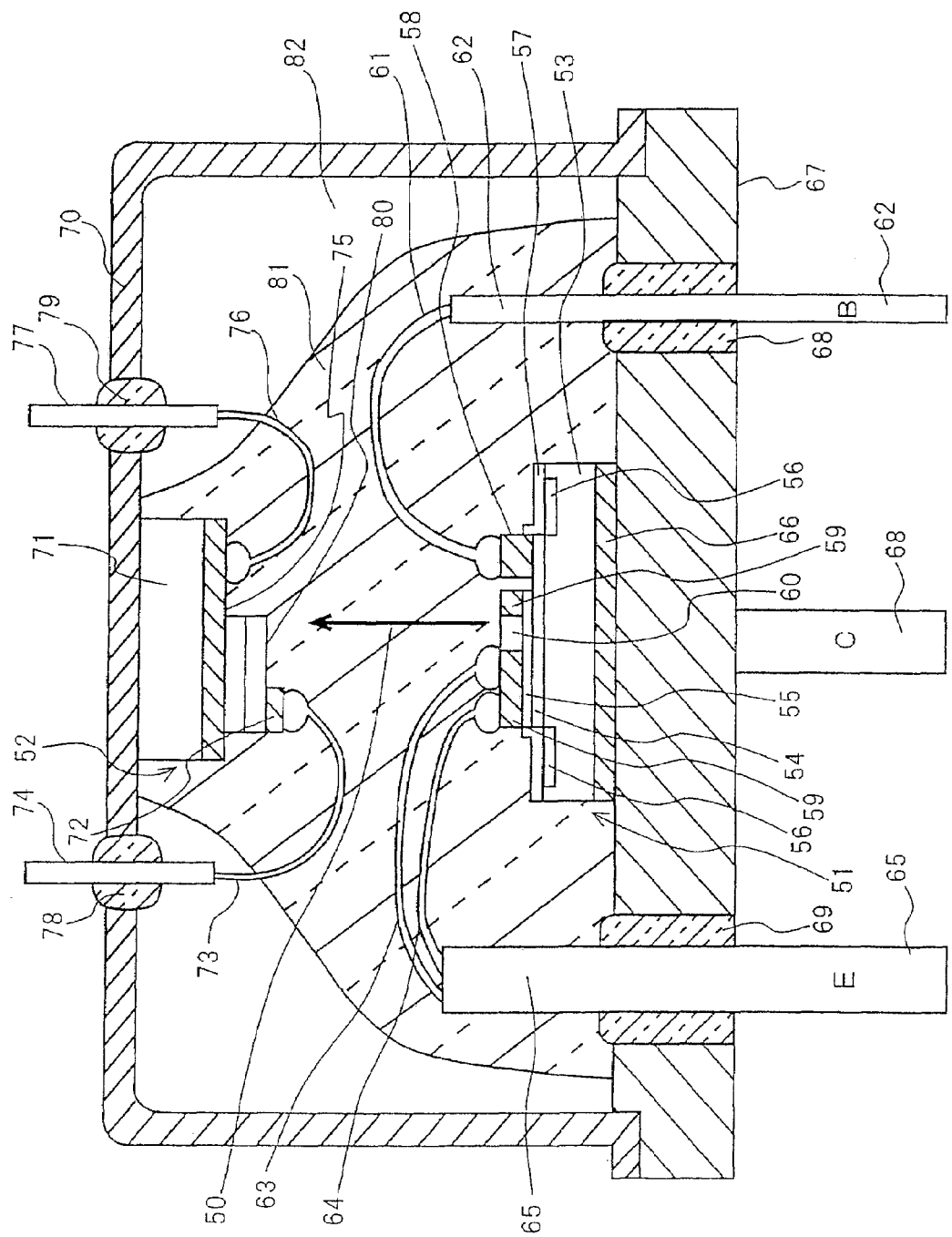
FIG. 4 is a cross-sectional view of a photocoupled wide gap power semiconductor device according to a fourth example of the invention.

A semiconductor device according to a third example of the invention is a photocoupled wide gap power semiconductor device and FIG. 4 is a cross-sectional view of the semiconductor device. In FIG. 4, a GaN (gallium nitride)-npn bipolar transistor 51 having a withstand voltage of 3 kV and a current capacity of 200 A is used as a main power semiconductor element having a light emitting function. As a light receiving element, an SiC photodiode 52 is used. The SiC photodiode 52 and the GaN-npn bipolar transistor 51 are provided oppositely each other within a package.

In the GaN-npn bipolar transistor 51 shown in FIG. 4, a p-type GaN base region 54 about 1.7 μm thick and a n-type emitter region 55 about 3 μm thick having a high impurity concentration are formed on the upper surface of a n-type GaN collector region 53 about 300 μm thick having a high impurity concentration in that order. A collector electrode 66 is provided on the lower surface of the GaN collector region 53. A n-type field-relief region 56 is formed in the collector region 53 on the periphery of the GaN base region 54. A metal base electrode 58 is provided on the right end of the GaN base region 54. A metal emitter electrode 59 having a light-emitting aperture 60 is provided on the n-type emitter region 55. A surface protective film 57 having a two-layer structure of a silicon nitride layer and a silicon dioxide layer is formed on the GaN collector region 53 and the field-relief region 56.

The base electrode 58 is connected to a base terminal 62 by using a gold lead wire 61. The emitter electrode 59 is connected to an emitter terminal 65 by using gold lead wires 63 and 64. The collector electrode 66 is mounted on a metal support 67 having a collector terminal 68. The lead wires 61, 63, 64, 73, and 76, the emitter terminal 65, the base terminal 62, the collector terminal 68, an anode terminal 74, and a cathode terminal 77 are electrical connecting means. The lead wires 61, 63, 64, 73, and 76, can be each plurally used so as to be connected in parallel with one another according to the values of currents which flow through the individual lead wires.

The light-receiving portion 80 of the SiC photodiode 52 is adhered to the inner surface of a cap 70 via an insulating plate 71 such as aluminum nitride so as to be opposite to the light-emitting aperture 60 of the GaN-npn bipolar transistor 51. The anode electrode 72 of the SiC photodiode 52 is connected to the metal anode terminal 74 by using the gold lead wire 73. A cathode electrode 75 is connected to the cathode terminal 77 by using the gold lead wire 76.

The anode terminal 74 and the cathode terminal 77 are each connected to external wirings. The anode terminal 74 and the cathode terminal 77 are fixed to the holes of the cap 70 via high-melting insulating glasses 78 and 79. The GaN-npn bipolar transistor 51, the SiC photodiode 52, the lead wires 61, 63, 64, 73, and 76, one end of the base terminal 62, and one end of the emitter terminal 65 are covered with a coverture 81. The coverture 81 is a synthetic high-molecular compound which contains polyethylsilsesquioxane as an organosilicon polymer A and polydimethylsiloxane as an organosilicon polymer B.

An example of a method for manufacturing the photocoupled wide gap power semiconductor device according to the third example will be described below. The prefabricated GaN-npn bipolar transistor 51 is soldered at a predetermined place in the support 67 by using a high-melting gold silicon solder. The two gold lead wires 63 and 64 having diameters of 80 micrometers are connected between the emitter electrode 59 and the emitter terminal 65 by using a lead bonding apparatus. The gold lead wire 61 is connected between the base electrode 58 and the base terminal 62. The pre-curing synthetic high-molecular compound material, which becomes the coverture 81 after curing, is thickly applied so as to cover the GaN-npn bipolar transistor element 51.

The prefabricated SiC photodiode 52 is soldered to the inner surface of the metal cap 70 via the aluminum nitride insulating plate 71 by using a high-melting gold silicon solder. Next, the 80-micrometer-diameter gold lead wire 73 is connected between the anode electrode 72 and the anode terminal 74 by using the lead bonding apparatus. Moreover, the gold lead wire 76 is connected between the cathode electrode 75 and the cathode terminal 77. Then the pre-curing synthetic high-molecular compound material is thickly applied so as to cover the SiC photodiode 52 and the vicinity of a junction between the lead wires 73 and 76 and the SiC photodiode 52. Finally, the metal cap 70 is paired with the support 67 such that the light-receiving portion 80 of the SiC photodiode 52 is opposite to the light-emitting aperture 60 of the GaN-npn bipolar transistor 51 and that the individual synthetic high-molecular compound materials, which cover the photodiode 52 and the bipolar transistor 51, come in contact with each other, following which the metal cap 70 and the support 67 are welded together in a nitrogen atmosphere. As a result, the individual synthetic high-molecular compound materials are combined with each other into one piece to take the shape of the coverture 81 shown in FIG. 4. Thereafter, the synthetic high-molecular compound is heated to a predetermined temperature to cure the compound in such a way that a certain degree of flexibility is obtained, thereby the formation of the coverture 81 is completed.

An example of operation of the photocoupled wide gap power semiconductor device according to the third example will be described below. To begin with, an electric potential of the collector terminal 68 of the GaN-npn bipolar transistor 51 is made higher than that of the emitter terminal 65 to effect the state of a forward bias. Then, by making an electric potential of the base terminal 62 equal to that of the emitter terminal 65, an off state, in which no current flows, is maintained. As a result, a high withstand voltage of 3 kV can be achieved. By making an electric potential of the anode terminal 74 lower than that of the cathode terminal 77, the SiC photodiode 52 is brought into the state of a reverse bias.

On-off operation is performed as follows. An electric potential of the base terminal 62 is made higher than that of the emitter terminal 65 to feed a base current from the base terminal 62 toward the emitter terminal 65. As a consequence, electrons are injected to the GaN-npn bipolar transistor 51 from the emitter electrode 59 and the transistor 51 is turned on, thereby a light 50 with a wavelength of about 390 to 570 nm is generated. The SiC photodiode 52 receives the light 50, following which a photo current whose amount corresponds to that of the light 50 flows between the anode terminal 74 and the cathode terminal 77.

When the electric potential of the base terminal 62 is made equal to or lower than that of the emitter terminal 65 at the time when the GaN-npn bipolar transistor 51 is in the on state, the injection of the electrons stops, thereby the current flowing between the collector electrode 66 and the emitter electrode 59 is interrupted and the light emission is stopped as well. Since the light becomes nonpresent, the photo current becomes nonpresent, thereby the SiC photodiode 52 is turned off.

The GaN-npn bipolar transistor 51 according to this example had a withstand voltage of about 3.5 kV and it was possible to maintain the withstand voltage even at an elevated temperature of 250° C. A leakage current density at a voltage of 3 kV was as excellent as $2 \times 10^{-4}$ A/cm$^2$ or lower. Besides, a dielectric strength voltage between the GaN-npn bipolar transistor 51 and the SiC photodiode 52 was 5 kV or higher and a leakage current at 5 kV was $1 \times 10^{-5}$ A/cm$^2$ or lower. Even after a voltage application test was conducted at a temperature of 250° C. for a continuous 1000 hours, an increase in the leakage current stood at a very small value which falls within the range of its measurement error. Despite having a high withstand voltage of 3 kV or higher, a current with a high current density of 150 A/cm$^2$ can be fed. Moreover, even after a current was passed continuously in a high temperature atmosphere of 200° C. for 500 hours, the coverture 81 of the synthetic high-molecular compound had no deformation, crack and cloudiness.

Moreover, even after the power semiconductor device was energized in an atmosphere of a high temperature of 80° C. and a high humidity of 85% for 200 hours, the coverture 81 of the synthetic high-molecular compound had no deformation, crack, and cloudiness. A forward voltage given during energization conducted at a temperature of 200° C. and a current density of 150 A/cm$^2$ was 5.3 V and a change in the forward voltage prior to and subsequent to the test took on a small value which falls within the range of its measurement error. After the test, when a conduction voltage of 3 kV was applied at a temperature of 250° C., a leakage current density was $3 \times 10^{-4}$ A/cm$^2$ or lower and remained about the same as that given before the test. The conduct of a rupture test made it possible to confirm that the coverture 81, which is made of the synthetic high-molecular compound containing polyethylsilsesquioxane as the organosilicon polymer A and polydimethylsiloxane as the organosilicon polymer B, also firmly adheres to the GaN exposed in the sides of the GaN-npn bipolar transistor 51. Incidentally, turn-on and turn-off times were as short as 0.09 microseconds and 0.15 microseconds respectively and the switching times also remained the same prior to and subsequent to the test.

FOURTH EXAMPLE

Figure 5:
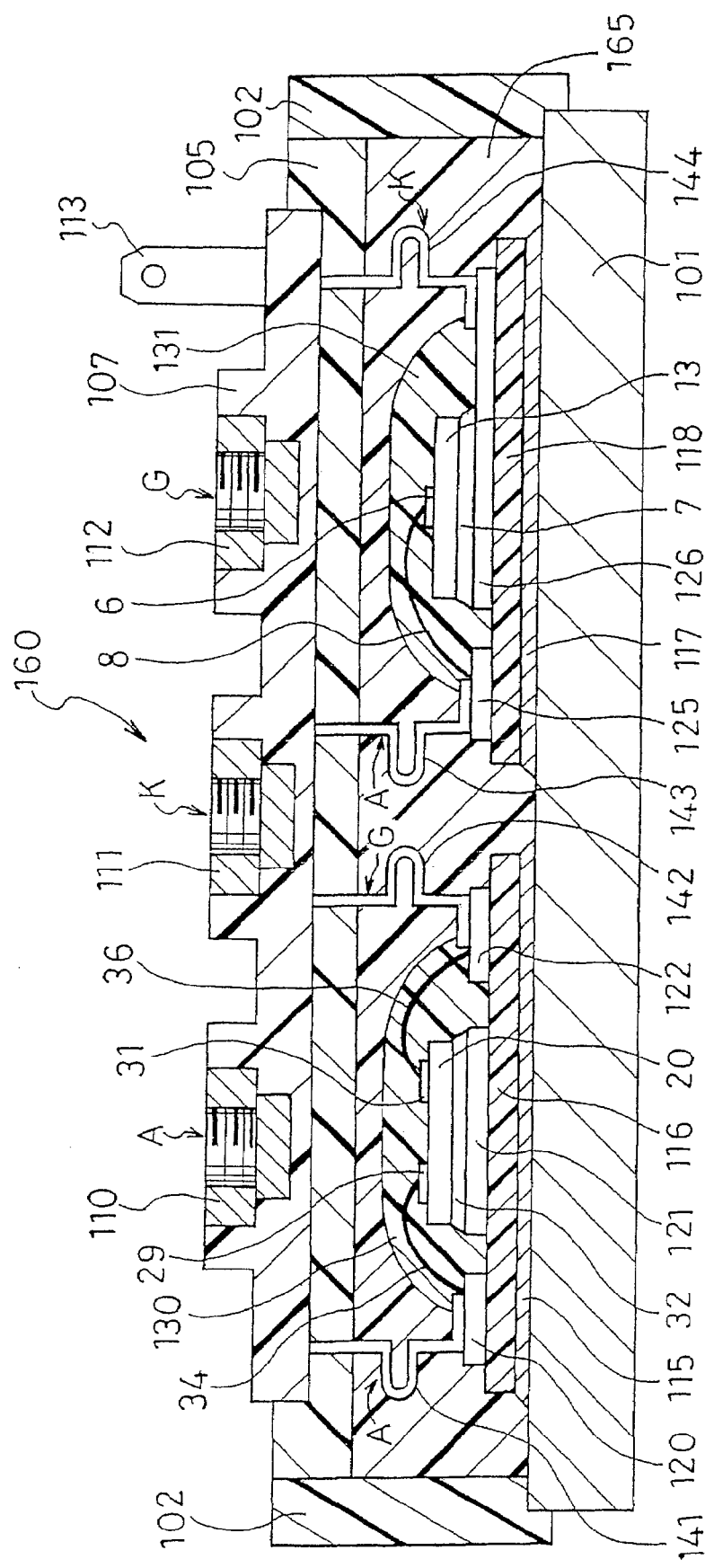
FIG. 5 is a cross-sectional view of an SiC-GTO module according to a fifth example of the invention.
Figure 6:
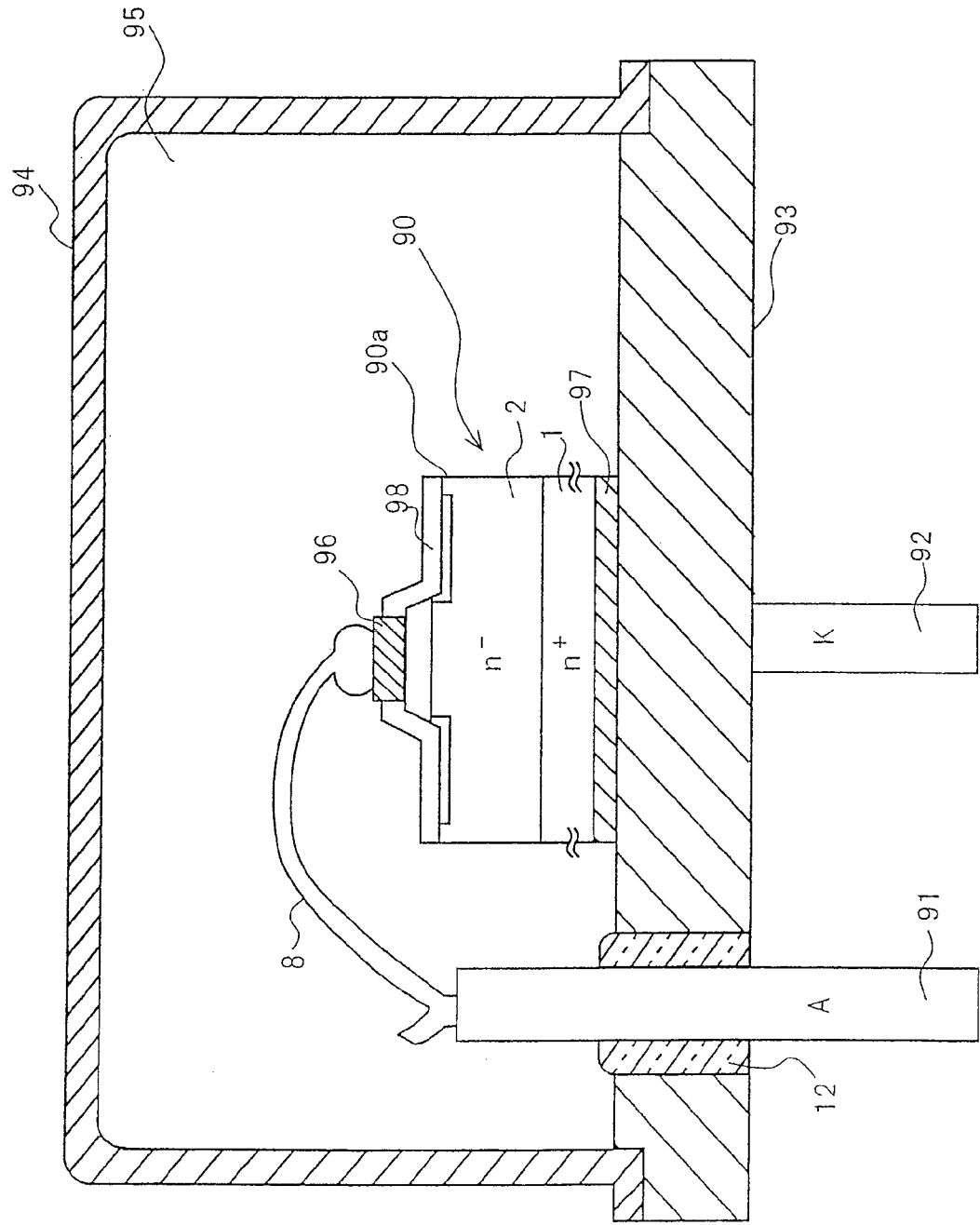
FIG. 6 is a cross-sectional view of a conventional SiC diode device.

A high-heat-resistant semiconductor device according to a fourth example of the invention is a mold-type SiC-GTO module. The module includes an SiC-GTO element and an SiC diode element in one package. FIG. 5 is a cross-sectional view of the main part of the module. The SiC-GTO element 20 is the element with a withstand voltage of 5 kV described in the second example. The SiC diode element 13 has the same structure as that of the diode element described in the first example except that the SiC diode element 13 is designed so as to have a withstand voltage of 5 kV.

In FIG. 5, two insulating substrates 116 and 118 made of, for example, aluminum nitride are each adhered onto the upper surface of a nickel-plated copper substrate 101 having high thermal conductivity at a predetermined distance away by using hot solders 115 and 117.

Internal wirings 120, 121, and 122 are formed on the insulating substrate 116 by using a pattern of copper foil. The cathode electrode 32 of the SiC-GTO element 20 is adhered onto the internal wiring 121 by using a hot solder. The anode electrode 29 of the SiC-GTO element 20 is connected to the internal wiring 120 by using a lead wire 34 as an electrical connecting portion. Also, the gate electrode 31 of the SiC-GTO element 20 is connected to the internal wiring 122 by using a lead wire 36 as an electrical connecting portion.

Internal wirings 125 and 126 are formed on the insulating substrate 118 by using a pattern of copper foil. The cathode electrode 7 of the SiC diode element 13 is adhered onto the internal wiring 126 by using a hot solder. The anode electrode 6 of the SiC diode element 13 is connected to the internal wiring 125 by using a lead wire 8 as an electrical connecting portion.

A resin of a first synthetic high-molecular compound is applied so as to cover most of the SiC-GTO element 20, lead wires 34 and 36, and internal wirings 120 and 122 to form a coverture 130. Likewise, a resin of a synthetic high-molecular compound is applied so as to cover most of the SiC diode element 13, lead wire 8, and internal wirings 125 and 126 to form a coverture 131. The covertures 130 and 131 of the synthetic high-molecular compound are the same synthetic high-molecular compounds as that described in the second example which contain polymethylsilsesquioxane and polymethylphenylsiloxane as primary ingredients. After the curing of the covertures 130 and 131, a robust frame 102 is attached which is made of a hard resin such as epoxy resin, includes the copper substrate 101 as a component, and constitutes a package (case or enclosure) by being attached to the copper substrate 101. A robust cover 105 made of the same epoxy resin is attached to the upper portion of the frame 102 to form the package.

As a method for attaching the frame 102 and the cover 105 to the copper substrate 101, there is a method of attaching them through the use of screws or the like or of adhering them through the use of an adhesive. The frame 102 and the cover 105 are made of, for example, the epoxy resin using imidazole as a curing agent and having a glass transition temperature of about 325° C. A terminal plate 107 is provided on the cover 105. The terminal plate 107 has an anode terminal 110, a cathode terminal 111, and a gate terminal 112 each having an internal thread and also has a spare terminal 113. The internal wiring 120 linked to the anode electrode 29 of the SiC-GTO element 20 is connected to the anode terminal 110 via a connecting wire 141, which is made of aluminum or the like, and a conductor (not shown) which passes between the cover 105 and the terminal plate 107. The internal wiring 121 connected to the cathode electrode 32 of the SiC-GTO element 20 is connected to the cathode terminal 111 by using a conductor (not shown). The internal wiring 122 linked to the gate electrode 31 of the SiC-GTO element 20 is connected to the gate terminal 112 via a connecting wire 142, which is made of aluminum or the like, and a conductor (not shown).

The internal wiring 125 linked to the anode electrode 6 of the SiC diode element 13 is connected to the cathode terminal 111 via an aluminum connecting wire 143 and a conductor (not shown). The internal wiring 126 connected to the cathode electrode 7 of the SiC diode element 13 is connected to the anode terminal 110 via a connecting wire 144, which is made of aluminum or the like, and a conductor (not shown).

A clearance within the package constituted by the copper substrate 101, the frame 102, and the cover 105 is filled with a gel filler 165 of a second synthetic high-molecular compound. The filler 165 is a synthetic high-molecular compound which contains polyphenylsilsesquioxane and polydimethylsiloxane as primary ingredients. The filler 165 also acts as a buffer agent which prevents the internal elements from vibrating due to mechanical shock externally applied to the module 160. Because of this, polydimethylsiloxane contained in the filler 165 is made as a polymer having a longer molecular structure than that of polymethylphenylsiloxane contained in the covertures 130 and 131 of the synthetic high-molecular compound to become more flexible.

By adopting such a configuration, the module 160 can be obtained which has the SiC-GTO element 20 and the SiC diode element 13 connected in inversely parallel to each other within the package and which has the anode terminal 110, the cathode terminal 111, and the gate terminal 112, all of which lead to the outside.

The withstand voltage of the SiC-GTO module 160 according to this example was about 5.7 kV and it was possible to maintain such a withstand voltage even at an elevated temperature of 250° C. at which SiC-GTO modules were inoperable. A leakage current density at a voltage of 5 kV was as excellent as $2\times10^{-4}$ A/cm$^2$ or lower. Besides, although a current having a high current density of 200 A/cm$^2$, which cannot be fed through a Si diode with a high withstand voltage of 3 kV or higher, was fed through the SiC-GTO module 160 according to this example in a hot-air atmosphere of 250° C. to operate the module 160 for 200 hours, abnormalities such as cracks and deformation did not occur in the covertures 130, 131, and 165. During the energization conducted at a temperature of 250° C. and a current density of 200 A/cm$^2$, a forward current was 4.3 V and therefore, a variation in the forward current prior to and subsequent to the 200-hour operation was in the range of its measurement error and hence, the forward current changed little.

And furthermore, a leakage current density at a voltage of 5 kV given after the operation was $3\times10^{-4}$ A/cm$^2$ or lower at a temperature of 250° C. as well and remained about the same as that given before the operation. In addition, a leakage current density at a voltage of 5 kV given after the 200-hour operation was also $3\times10^{-4}$ A/cm$^2$ or lower at a temperature of 250° C., so that the leakage current density remained about the same both prior to and subsequent to the operation. This is because the covertures 130 and 131 of the synthetic high-molecular compound, which contains polydimethylsilsesquioxane as an organosilicon polymer A and polydiphenylmethylsiloxane as an organosilicon polymer B, firmly adheres to not only the individual passivation films of the SiC-GTO element and the diode element but the exposed sides of the elements. The turn-on time of the SiC-GTO element 20 is 0.4 microseconds and the turn-off time is 0.7 microseconds. Since the turn-off time is at most one-twentieth that of a silicon GTO element having a withstand voltage of 6 kV, the module operates at high speed. There has been no variation with time in the turn-on and turn-off times as well.

Up to this point, the four, that is, first to fourth examples have been described, while the invention covers more scope of application or derived structures. The invention is also applicable to, for example, a MOSFET, a junction FET, a SIT, an IGBT, a MOS thyristor, and the like of wide gap semiconductor elements. And furthermore, the invention is applicable to a high-frequency high-power MESFET, a lateral MOSFET, a junction FET, a Schottky diode element of a HEMT, a JBS (junction barrier controlled Schottky) diode and the like as well.

In the examples described above, only the elements and the light-receiving element using SiC and GaN have been described, while the invention is also applicable to elements using other wide gap semiconductor materials. In particular, the invention is effectively applicable to elements using diamond and gallium phosphide wide gap semiconductor materials as well.

Also, the invention is naturally applicable to semiconductor devices having configurations in which the polarities of their semiconductor regions are reversed, that is, n-type polarities are changed to p-type polarities, and vice versa.

In addition to such polyphenylsilsesquioxane, polymethylsilsesquioxane, and polyethylsilsesquioxane, the organosilicon polymer A may be polypropylsilsesquioxane or a mixture of at least two of these polyquioxanes. Besides, in addition to such polydimethylsiloxane and polydiphenylsiloxane, the organosilicon polymer B may be polydiethylsiloxane, polyphenylmethylsiloxane, or a mixture of at least two of these polysiloxanes.

In the first and second examples, the TO-type semiconductor devices using the metal caps 43 and 70 have been described, while the invention is also applicable to semiconductor devices using high-heat-resistant resin caps instead of metal caps. Also, in addition the TO type, the configuration of semiconductor devices may be a stud type, a flat type, a SIP type using high-heat-resistant resin, or a mold type generally used in Si power modules. In the third example, the photocoupled semiconductor device has been exemplified, while the invention is applicable to semiconductor devices having only light-emitting or light-receiving semiconductor elements as well.

The synthetic high-molecular compound enclosure of the mold-type module according to the fourth example may be made of other high-heat-resistant epoxy resins such as an epoxy resin using phenolic novolac as a curing agent and Kevlar resin (trade name). Also, in addition to polydimethylsiloxane, the organosilicon polymer B contained in the synthetic high-molecular compound filler may be polydiphenylsiloxane, polydiethylsiloxane, polyphenylmethylsiloxane, or a mixture of at least two of these polysiloxanes. And further, the synthetic high-molecular compound filler may contain only the organosilicon polymer B without containing the organosilicon polymer A.

INDUSTRIAL APPLICABILITY

The present invention is applicable to a wide gap semiconductor device having a high withstand voltage and a high heat resistance.

The foregoing description and examples have been set forth merely to illustrate the invention and are not intended to be limiting. Since modifications of the described embodiments incorporating the spirit and substance of the invention may occur to persons skilled in the art, the invention should be construed broadly to include all variations within the scope of the appended claims and equivalents thereof.

What is claimed is:

1. A semiconductor device comprising:
   at least one semiconductor element mounted on a thermally conductive substrate;
   electrical connecting portions for electrically connecting the semiconductor elements to external devices;
   a first synthetic high-molecular compound mainly comprised of polymethylsilsesquioxane and polymethylphenylsiloxane which covers the semiconductor elements and at least part of the electrical connecting portions and which contains a compound having a three-dimensional steric structure formed by linking plural third organosilicon polymers with covalent bonds resulting from an addition reaction, said third organosilicon polymers being formed by linking at least one first organosilicon polymer having a crosslinked structure using siloxane with at least one second organosilicon polymer having a linear linked structure using siloxane through siloxane bonds;
   a case of a hard resin provided on the substrate so as to house the semiconductor elements and the electrical connecting portions covered with said first synthetic high-molecular compound;
   a second synthetic high-molecular compound which is mainly comprised of polyphenylsilses-quioxane and polydimethylsiloxane, and which fills a remaining space within said case such that said second high-molecular comuound acts as a buffer that prevents the semiconductor elements from vibrating due to a mechanical shock applied to the semiconductor device: the polydimethylsiloxane of said second synthetic high-molecular compound having a longer polymeric molecular structure than the polymethylphenylsiloxane of said first synthetic high-molecular compound; and
   external connecting terminals which are connected to the electrical connecting portions and which lead outside the case.

2. The semiconductor device as claimed in claim 1, in which the first synthetic high-molecular compound contains a compound having a three-dimensional steric structure which is formed by linking plural third organosilicon polymers, which have been formed by alternately and linearly linking a first organosilicon polymer having a crosslinked structure using siloxane with a second organosilicon polymer having a linear linked structure using siloxane through a siloxane bond, with covalent bonds resulting from additional reaction.

3. The semiconductor device as claimed in claim 1, in which
   the semiconductor elements are either SiC semiconductor elements using wide gap semiconductors or GaN semiconductor elements using wide gap semiconductors.

4. The semiconductor device as claimed in claim 1, in which the semi-conductor elements are an SiC-GTO element and an SiC diode element and are connected in reversely parallel with each other by the electrical connecting portions within the case.

* * * * *